United States Patent
Krivokapic et al.

[11] Patent Number: 6,127,717
[45] Date of Patent: Oct. 3, 2000

[54] TOTALLY SELF-ALIGNED TRANSISTOR WITH POLYSILICON SHALLOW TRENCH ISOLATION

[75] Inventors: Zoran Krivokapic, Santa Clara; Ognjen Milic, Burlingame, both of Calif.

[73] Assignee: Advanced Micro Devices, Sunnyvale, Calif.

[21] Appl. No.: 09/103,181

[22] Filed: Jun. 24, 1998

[51] Int. Cl.[7] ............................. H01L 29/00; H01L 29/06
[52] U.S. Cl. .................. 257/505; 257/506; 257/508; 257/618; 257/623
[58] Field of Search .................... 257/505, 508, 257/412, 623, 506, 618

[56] References Cited

U.S. PATENT DOCUMENTS

| | | |
|---|---|---|
| 5,494,837 | 2/1996 | Subramanian et al. |
| 5,565,697 | 10/1996 | Asakawa .................. 257/508 |
| 5,859,466 | 1/1999 | Wada ....................... 257/508 |
| 5,880,508 | 3/1999 | Wu ........................... 257/412 |

OTHER PUBLICATIONS

Article entitled, "Spatially Confined Nickel Disilicide Formation at 400° C. On Ion Implantation Preamorphized Silicon" Author: Erokin et al.

*Primary Examiner*—Mahshid Saadat
*Assistant Examiner*—Jesse A. Fenty
*Attorney, Agent, or Firm*—Brinks Hofer Gilson & Lione

[57] ABSTRACT

A totally self-aligned transistor with shallow trench isolation. A single mask is used to align the source, drain, gate and isolation areas. Overlay error is greatly reduced by the use of a single mask for these regions. Channel dopant deposited in the gate area is also self-aligned to the gate of the transistor.

6 Claims, 2 Drawing Sheets

TOTALLY SELF-ALIGNED TRANSISTOR WITH POLYSILICON SHALLOW TRENCH ISOLATION

BACKGROUND OF THE INVENTION

Precision is very important in the manufacture of semiconductor integrated circuits. Semiconductor integrated circuits commonly include many transistors and active devices that are formed by implanting, depositing and etching certain substances onto the surface of a substrate. The most commonly used substrate for the manufacture of semiconductor integrated circuits is silicon, although those skilled in the art will recognize that many other known and as yet unknown substances can be used for a substrate.

The implanting, depositing and etching process steps are used in the formation of the multi-layer structure that makes up the semiconductor integrated circuit. The technique typically used to implant, deposit and etch employs a series or set of masks that expose or open windows to the surface of the semiconductor integrated circuit in formation. It is not uncommon to require dozens of different masks to implant, deposit and etch the various layers created in the multi-layer structure. Today, these structures can include, for example, three, four or even five layers of metal interconnect in addition to the active devices included in the semiconductor integrated circuit.

As the size, and accordingly the device geometries, of these semiconductor integrated circuits continues to shrink, one problem that emerges is the alignment of the many masks used in the manufacturing process. In the manufacture of submicron devices common today, such as 100 nanometer transistors, the alignment of the mask sets used in the manufacturing process can become critical to the operation of the resulting circuits. Improperly aligned or misaligned masks can prevent device operation and thus reduce the yield of the semiconductor integrated circuits manufactured.

One common mask alignment problem is the degree of overlay between different masks in a multiple mask set. Misalignment between successive masks used in the manufacture of the semiconductor integrated circuit can produce an overlay error that may ultimately result in the failure of the circuits to operate properly. Specifically, this overlay error may cause significant differences in the source and drain areas defined for these semiconductor integrated circuits.

Overlay error between the source/drain mask, which is used to define the isolation area between the active areas, and the poly/gate mask thus becomes critical.

In order to reduce the alignment problems created by the use of multiple mask sets, certain self-alignment techniques have been attempted. What is lacking in the art is a totally self-aligned transistor and a method for making the self-alignment transistor where the gate, source, drain and isolation area of the device are all self-aligned using a single mask. What is also lacking is the self-alignment of the channel dopant to the gate of such a transistor.

BRIEF SUMMARY OF THE INVENTION

In view of the above, a totally self-aligned transistor with polysilicon shallow trench isolation and method for making same is provided. According to the device of the invention, the totally self-aligned transistor includes a substrate layer formed to define a plateau region having an elevation higher than the substrate layer. At least one shallow trench is disposed adjacent to the plateau region. An oxide spacer is disposed between the at least one shallow trench and a first side of the plateau region. A channel area is disposed on a top side of the plateau region and defines a source region and a drain region. At least one channel dopant is then deposited in the channel area of the plateau region. A gate area is disposed above the channel area, and a gate is defined by the deposition of a metal substance.

According to the method of the invention, a totally self-aligned transistor with polysilicon shallow trench isolation is formed by depositing a photoresist layer in a predetermined manner over a nitride layer, the nitride layer being disposed over an oxide layer deposited over a substrate layer. The nitride layer is etched away in areas other than where photoresist was deposited to reveal at least one nitride island. An undersized trench mask is aligned to protect the area surrounding the at least one nitride island and to take into account any overlay error. The oxide and substrate layers are etched outside of the trench mask to define at least one shallow trench. At least one inner and one outside oxide spacer is then deposited, along with depositing channel dopants and source and drain extensions. The at least one nitride island is then etched away, and a trench oxide layer is deposited in the at least one shallow trench. A metal substance is deposited adjacent the at least one inner oxide spacer.

As can be seen, the present invention provides a totally self-aligned transistor that reduces or eliminates the overlay error caused by the use of multiple mask sets in the formation of semiconductor integrated circuits. The present invention provides a totally self-aligned transistor where the source, gate and drain of the transistor are all aligned to the isolation area of the device through the use of a single mask to form each of these elements. Deposition of tungsten in the gate area of this device also provides a mid-gap electrode for the totally self-aligned transistor. The present invention thus helps to improve device density and shrink the overall size of semiconductor integrated circuits, as well as add new functionality to such devices.

These and other features and advantages of the invention will become apparent to those skilled in the art upon a review of the following detailed description of the presently preferred embodiments of the invention, taken in conjunction with the appended drawings.

DETAILED DESCRIPTION OF THE PRESENTLY PREFERRED EMBODIMENTS OF THE INVENTION

Figure 1:
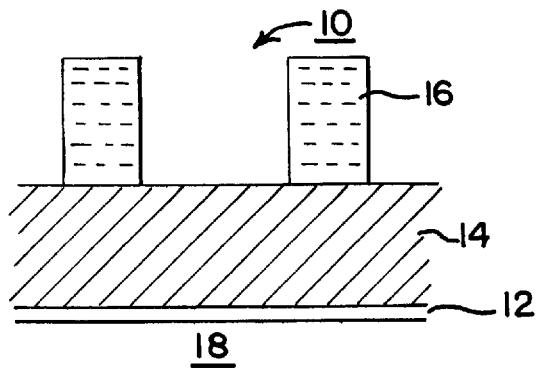
FIG. 1 illustrates a cross-sectional view of one presently preferred embodiment of the invention showing a photoresist layer deposited over a silicon nitride layer.

Referring now to the drawings, were like reference numerals represent like elements throughout, one presently preferred embodiment of the invention is generally shown in FIG. 1. In FIG. 1, the beginning steps to form a totally self-alignment transistor with polysilicon shallow trench isolation 10 is shown. Photoresist 16 is preferably deposited over a silicon nitride ($Si_3N_4$) layer 14, which is in turn deposited over a layer of silicon dioxide ($SiO_2$) 12. The photoresist mask (not shown) that defines the totally self-aligned transistor 10 is aligned over the silicon nitride layer 14, which enables better control of critical dimensions. Preferably, the silicon nitride layer 14 is deposited to a thickness of 200–500 nanometers and the silicon dioxide layer 12 is deposited to a thickness of 10–20 nanometers. The silicon dioxide layer 12 is deposited over a silicon (Si) substrate 18.

Figure 2:
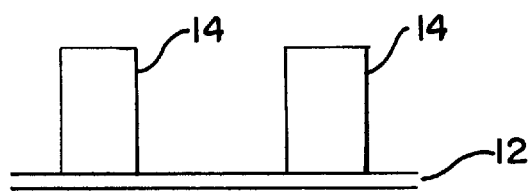
FIG. 2 is a cross-sectional view showing the etching of the silicon nitride layer shown in FIG. 1.

Referring now to FIG. 2, an etch step is performed and the photoresist layer 16 is washed away to reveal two silicon nitride islands 14 disposed over the silicon dioxide layer 12. The silicon nitride layer 14 is etched, as though skilled in art will appreciate, in areas where the photoresist layer 16 does not appear. The silicon nitride layer 14 is also etched to the point of and stops at the level of the silicon dioxide layer 12.

Figure 3:
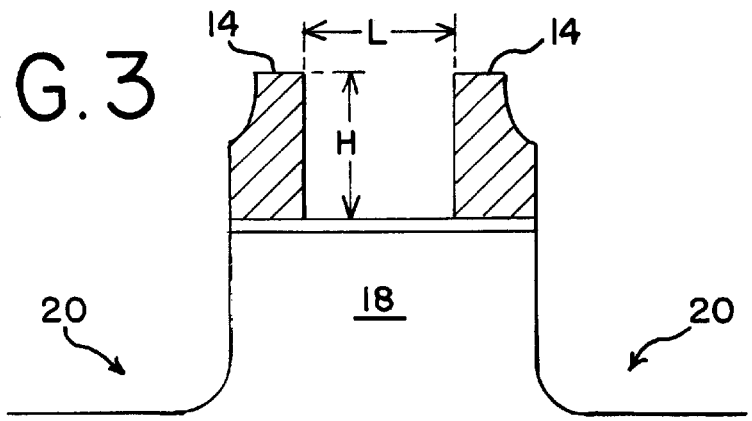
FIG. 3 is a cross-sectional view showing the etch of the underlying silicon substrate shown in FIG. 2 to create a shallow trench.
Figure 4:
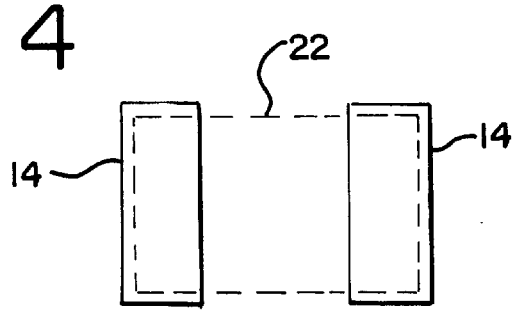
FIG. 4 is a top plan view showing the alignment of the photoresist mask used in connection with FIG. 3.

Referring next to FIG. 3, a trench mask (not shown) is used to protect the exposed area outside the nitride layer 14. Preferably, the trench mask should be undersized taking into account any overlay error, as shown in FIG. 4. A gate electrode (see FIGS. 6 and 7) is then deposited in the area between the nitride islands 14.

As shown in FIG. 4, the entire photoresist rectangle 22 is preferably disposed between the boundaries of the nitride islands 14. Thus, in forming the shallow trenches 20 (FIG. 3) the photoresist trench mask is disposed in an area overlapping the nitride islands 14, as shown in the top view of FIG. 4.

Next, a thin thermal oxidation layer 38 is grown at low temperature. Preferably, the oxidation layer 38 is grown to a thickness of approximately 10 nanometers and performed at a temperature of 900° C. After depositing the thin thermal oxide layer 38, outside and inner oxide spacers 30, 32 are formed by an anisotropic etch, which is followed by gate oxidation. The deposited thickness of the spacers 30, 32. is preferably of 30–80 nanometers.

Figure 5:
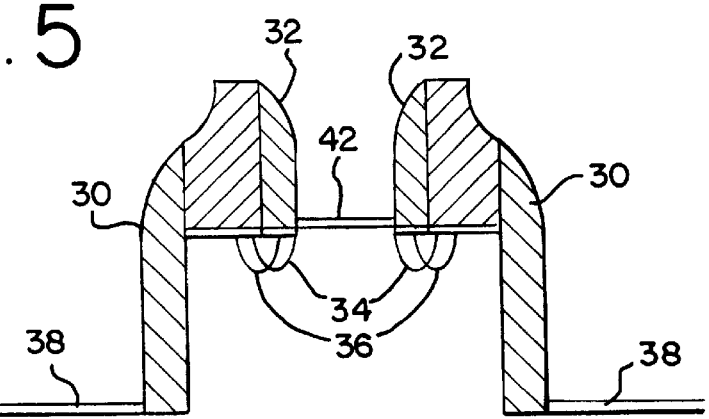
FIG. 5 is a cross-sectional view showing the formation of oxide spacers and the deposition of channel dopants in the structure shown in FIG. 3.

Channel dopants 34 are then implanted, preferably using a tilt implant technique. The channel dopants 34 are shown in FIG. 5. In the presently preferred embodiment of the invention, the tilt angle used for the implant is determined according to the following equation:

$$\theta = \arctan (L-t)L/H$$

The source and drain extensions 36 are then implanted, again preferably using a tilt implant technique. The angle preferably used for the tilt implant of the source and drain extensions 36 is determined according to the following equation:

$$\theta = \arctan (L/H)$$

As those skilled in the art will appreciate, in the above two equations, L represents the width of the gate opening (FIG. 3), H represents the height of the nitride island 14, and t represents half of the thickness of the subsequent oxide deposition.

Figure 6:
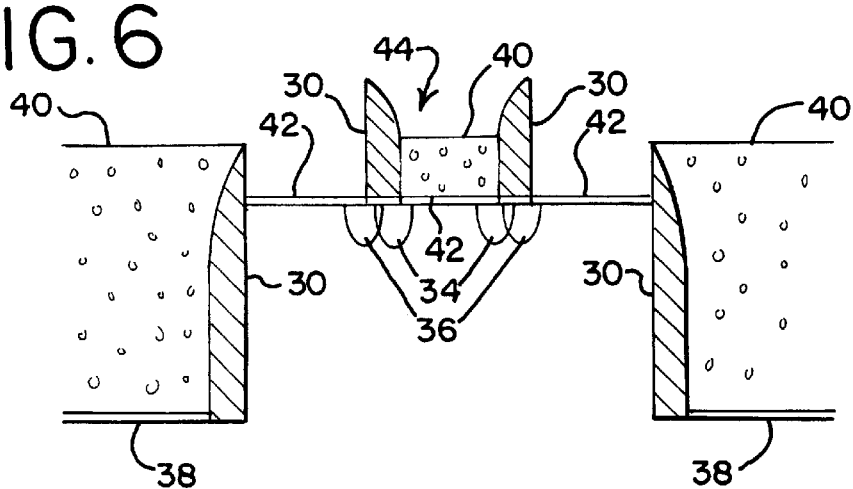
FIG. 6 is a cross-sectional view showing the etching of the silicon nitride islands and deposition of source/drain extensions to the structure shown in FIG. 5.
Figure 7:
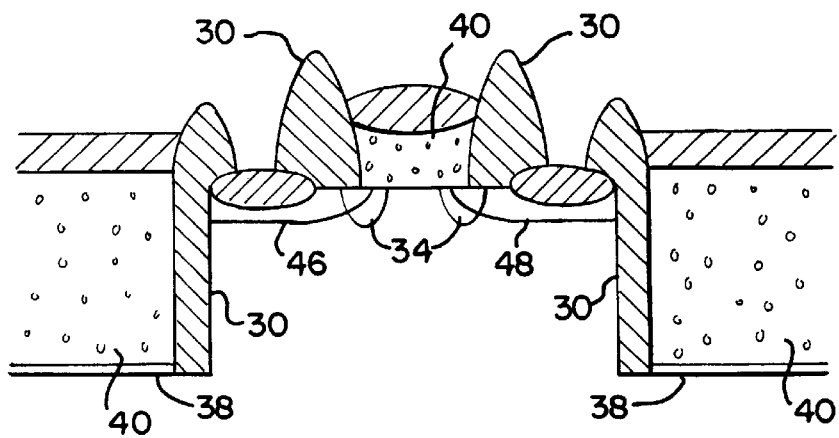
FIG. 7 is a cross-sectional view of one presently preferred embodiment of the totally self-aligned transistor with polysilicon shallow trench isolation.

Referring to FIG. 6, after thermal gate oxidation preferably to a thickness of 1–1.5 nanometers, a silicon nitride layer (not shown) is then deposited to a thickness of 1.0 nanometers. This step is followed by deposition of a polysilicon layer 40. The polysilicon layer 40 is polished back to the level of the nitride layer 14, which is followed by another polysilicon etch to a thickness of half of the height of the nitride layer 14 in the area of the gate opening 44. This half polysilicon layer 40 etch is deposited to prevent shortening of the gate to source and gate to drain ratios. The nitride islands 14 are then removed by a wet etch technique generally known in the art. Finally, source 46 and drain 48 are implanted, and the oxide 42 in the source and drain areas is removed. A cross-section of the totally self-aligned transistor with polysilicon shallow trench isolation 10 formed according to the above process is shown in FIG. 7.

It is to be understood that a wide range of changes and modifications to the embodiments described above will be apparent to those skilled in the art and are contemplated. It is therefore intended that the foregoing detailed description be regarded as illustrative, rather than limiting, and that it be understood that it is the following claims, including all equivalents, that are intended to define the spirit and scope of the invention.

We claim:

1. A totally self-aligned transistor with polysilicon shallow trench isolation comprising:

a substrate layer, the substrate layer formed to define a plateau region having an elevation higher than the substrate layer;

at least one shallow trench, the at least one shallow trench disposed adjacent to the plateau region;

at least one aligning nitride island formed on top of the plateau region, the at least one nitride island defining an exposed outer area adjacent a first side of the plateau region;

an oxide spacer, the oxide spacer disposed in the at least one shallow trench along the first side of the plateau region, and extending upwards to substantially cover the exposed outer area;

a channel area, the channel area disposed on a top side of the plateau region and adjacent the at least one nitride island opposite to the exposed outer area;

a source region and a drain region defined by removal of the at least one aligning nitride island;

at least one channel dopant deposited in the channel area of the plateau region; and a gate disposed above the channel area, the gate defined by the deposition of a metal substance.

2. The totally self-aligned transistor defined in claim 1, further comprising at least one second oxide spacer, the at least one second oxide spacer disposed between the gate and the source region.

3. The totally self-aligned transistor defined in claim 1, further comprising at least one second oxide spacer, the at least one second oxide spacer disposed between the gate and the drain region.

4. The totally self-aligned transistor defined in claim 1, further comprising source and drain extensions, the source and drain extensions deposited in the plateau region of the substrate layer in the areas of the source and drain regions.

5. The totally self-aligned transistor defined in claim 1, further comprising a gate oxide layer, the gate oxide layer deposited below the metal substance.

6. The totally self-aligned transistor defined in claim 1, wherein the metal substance comprises tungsten.

* * * * *